United States Patent [19]

Tsuda et al.

[11] Patent Number: 5,516,621
[45] Date of Patent: May 14, 1996

[54] PHOTOSENSITIVE MICROCAPSULE HAVING INCREASED PHOTOSENSITIVE SENSITIVITY

[75] Inventors: Masashi Tsuda, Aichi; Shigeru Kagayama, Owariasahi; Yasuhiro Hattori, Nagoya, all of Japan

[73] Assignee: Brother Kogyo Kabushiki Kaisha, Nagoya, Japan

[21] Appl. No.: 358,690

[22] Filed: Dec. 19, 1994

Related U.S. Application Data

[63] Continuation of Ser. No. 20,798, Feb. 22, 1993, abandoned.

[30] Foreign Application Priority Data

Apr. 9, 1992 [JP] Japan .................................. 4-088659
Aug. 4, 1992 [JP] Japan .................................. 4-208002

[51] Int. Cl.⁶ ........................... G03C 1/72; G03C 1/725; G03C 1/73; B32B 5/16
[52] U.S. Cl. .................. 430/138; 430/281.1; 430/286.1; 430/287.1; 428/402.2; 428/402.21; 428/402.24
[58] Field of Search ..................... 430/281, 286, 430/287, 138; 428/402.2, 402.21, 402.24

[56] References Cited

U.S. PATENT DOCUMENTS

| | | | |
|---|---|---|---|
| 2,800,457 | 7/1957 | Green et al. | |
| 2,800,458 | 7/1957 | Green et al. | |
| 3,429,827 | 2/1969 | Ruus | 430/138 |
| 4,680,244 | 7/1987 | Lehmann et al. | 430/66 |
| 4,766,037 | 8/1988 | Watanabe et al. | 430/138 |
| 4,830,947 | 5/1989 | Oka | 430/138 |
| 4,880,721 | 11/1989 | Ishikawa | 430/138 |
| 4,916,042 | 4/1990 | Sakojiri et al. | 430/138 |
| 4,954,417 | 9/1990 | Nakamura et al. | 430/138 |
| 5,011,762 | 4/1991 | Lee et al. | 430/281 |
| 5,063,130 | 11/1991 | Kato et al. | 439/96 |
| 5,153,260 | 10/1992 | Ueda et al. | 524/847 |

FOREIGN PATENT DOCUMENTS

| | | |
|---|---|---|
| 36-9168 | 6/1961 | Japan . |
| 42-446 | 1/1967 | Japan . |
| 42-771 | 1/1967 | Japan . |
| 51-9079 | 1/1976 | Japan . |
| 61-275742 | 12/1986 | Japan . |
| 62-39844 | 2/1987 | Japan . |
| 63-269146 | 11/1988 | Japan . |
| 63-316038 | 12/1988 | Japan . |
| 952807 | 3/1964 | United Kingdom . |

OTHER PUBLICATIONS

Grant & Hackh's Chemical Dictionary, 5th Edition, Editor R. Grant & C. Grant (1987) McGraw-Hill: New York, p. 192.

Primary Examiner—George F. Lesmes
Assistant Examiner—Bernard P. Codd
Attorney, Agent, or Firm—Oliff & Berridge

[57] ABSTRACT

The invention relates to a photosensitive microcapsule in which the image forming material comprises at least one of a dyeprecursor, a dye, and a pigment and the photosensitive material changes its mechanical strength by reacting to light. Moreover, the image forming material and the photosensitive material are separated from one another within the microcapsule. Therefore, the photosensitive microcapsule has high photosensitive sensitivity, yet can form an image with high resolution, high color reproduction and high density.

25 Claims, 4 Drawing Sheets

PHOTOSENSITIVE MICROCAPSULE HAVING INCREASED PHOTOSENSITIVE SENSITIVITY

This is a continuation of application Ser. No. 08/020,798 filed Feb. 22, 1993, now abandoned.

BACKGROUND OF THE INVENTION

1. Field of the Invention

The invention relates to a photosensitive microcapsule employed in an image forming device for forming an image, and more particularly, to a photosensitive microcapsule that does not reduce the density of the image formed and does not reduce the sensitivity of the microcapsule to exposure to light of a predetermined wavelength.

2. Description of Related Art

Conventionally, a photosensitive microcapsule encapsulating therein image forming material and photosensitive material, and an image forming method using the photosensitive microcapsules have been proposed. The image forming material also comprises at least one of a dye precursor, a dye, and a pigment. The photosensitive material changes its mechanical strength by reacting to light.

There is a photosensitive recording medium disclosed in Japanese Laid-Open Patent Publication No. 61-275742. The photosensitive recording medium comprises photosensitive silver halide, reducing agent, polymerizable compound, and the image forming material comprising at least one of a dye precursor, a dye, and a pigment, which are coated on a base sheet. In the photosensitive recording medium, at least the polymerizable compound and the image forming material are encapsulated in one microcapsule. Moreover, there is a photosensitive pressure-sensitive recording sheet disclosed in Japanese Laid-Open Patent Publication No. 62-39844, which comprises a base sheet and a plurality of microcapsules coated thereon. Each microcapsule encapsulates image forming material comprising colored dye and pigment and light hardening resin. The image forming material and the hardening resin are dissolved or dispersed in an organic solvent.

Each microcapsule involves the photosensitive material and the image forming material which are dissolved or mixed with each other therein. When the microcapsule is exposed to light, having a predetermined wavelength, the involved photosensitive material changes the mechanical strength of the microcapsule by reacting to the light. According to the above-mentioned property of the photosensitive material, if these microcapsules are exposed selectively to the light, the mechanical strength of the microcapsules is selectively changed. Further, if each microcapsule of which the mechanical strength is selectively changed has a pressure applied, the microcapsules having low strength, that is, unchanged strength, are ruptured. The image forming material flows from the ruptured microcapsules. The released image forming material is absorbed into or adhered onto a receiving medium so that an image is formed on the receiving medium.

However, in the above-mentioned microcapsules there are problems. A first problem is that an image formed with the above-mentioned microcapsules has an uneven density or has low resolution because the image forming material is condensed, or forms globules, in each microcapsule, that is it is not uniformly dispersed therein. Thus, when the image is formed on the receiving medium, each picture element which is formed with the image forming material, is formed as large blobs rather than a uniform image. To solve this first problem, it is preferable that the image forming material exists in the microcapsule as very fine particles. That is, it is preferable that the image forming material and the photosensitive material be completely dissolved in each other. Alternatively, it is desired that the image forming material be dispersed finely in the photosensitive material. However, even if an arbitrary image forming material and an arbitrary photosensitive material are selected and heated or are mixed mechanically, it is difficult to make the image forming material and the photosensitive material be completely dissolved in each other. Similarly, it is difficult to have the image forming material dispersed finely in the photosensitive material. In other words, if a photosensitive material and an image forming material are selected to be soluble in each other, the image forming material and the photosensitive material will be completely dissolved with each other. Alternatively, if a photosensitive material having a property for easily dispersing the image forming material is selected, the image forming material is dispersed finely in the photosensitive material.

However, in practice, the photosensitive material employed in the microcapsule is selected based on its photosensitive sensitivity property and the photosensitive wavelength and the image forming material is selected based on its coloring property and its color reproducing property. Therefore, if the image forming material and the photosensitive material are selected as mentioned above, it is very difficult to obtain an image forming material and a photosensitive material that are completely dissolved in each other or those in which the image forming material is dispersed finely in the photosensitive material.

A second problem occurs when the photosensitive sensitivity of the conventional microcapsule is insufficient. There are many kinds of the photosensitive material having sufficient photosensitive sensitivity. However, when the photosensitive material is mixed with the image forming material in the microcapsule, the photosensitive sensitivity of the photosensitive material is remarkably reduced. Therefore, in order to form the image with the microcapsules, there is a need to apply a great amount of energy to the microcapsules, that is, to expose the microcapsules with a great amount of energy for a long time. Therefore, it is difficult to employ the microcapsules in a copier or a printer because copiers and printers have to form an image quickly. Although precise reasons why the photosensitive sensitivity of the microcapsule is insufficient cannot be stated, it is believed that the image forming material, which does not contribute to the hardening of the photosensitive material, disturbs that hardening by actions such as polymerization.

SUMMARY OF THE INVENTION

The invention addresses and solves the problems mentioned above. It is an object of the invention to provide microcapsules having sufficient photosensitive sensitivity and color reproducing properties to form an image having high-resolution and high-density.

To achieve the above-mentioned object, there is provided a microcapsule of the invention involving an image forming material comprising a coloring agent selected from at least one of a dye, a pigment, and a dye precursor and a photosensitive material which changes the mechanical strength of the microcapsule by reacting to light, wherein the at least one coloring agent and the photosensitive material are separately encapsuled in each microcapsule.

To do this, either the image forming material or the photosensitive material exists as a consecutive portion, the other material exists as a dispersive portion. As a result, the image forming material and the photosensitive material can be separately encapsuled in one capsule. The above-mentioned condition is called as an emulsion condition. In this case, if either the image forming material or the photosensitive material has a lipophilic property, and the other material has a hydrophilic property, they are easily stabilized under the emulsion condition.

Alternatively, a very small, second microcapsule may exist in the microcapsule. Either the image forming material or the photosensitive material is found within the second microcapsule and the other material exists outside of the second microcapsule but inside of the microcapsule. The above-mentioned condition is called a double-capsule condition. In this case, it may be that both the image forming material and the photosensitive material have either the lipophilic property or the hydrophilic property.

Moreover, in either condition, that is, in the emulsion condition or the double-capsule condition, a dispersant may be employed. Because of the dispersant, the pigment and/or the dye are easily dispersed in the image forming material.

In the microcapsule having the above-mentioned structure, the image forming material is isolated from the photosensitive material under the emulsion condition or the double-capsule condition. Therefore, even if the image forming material is selected irrespective of the photosensitive material, the image forming material is prevented from being condensed in the microcapsule, that is from not being uniformly dispersed therein, due to the dispersant.

When an above-described microcapsule is exposed, based on an image information, the photosensitive material is hardened by the polymerization. At this time, the photosensitive material is isolated from the other material, such as the image forming material so that it does not influence the hardening of the photosensitive material. Therefore, the photosensitive material can fully use its hardening property. As a result, the microcapsules can be hardened by lower energy as compared with the conventional microcapsules.

Further, when the unexposed microcapsules have a pressure applied, the materials flow from the microcapsule. As mentioned above, in the involved materials, the image forming material is mixed with the dispersant. Therefore, the image forming material is prevented from being condensed in the microcapsule, that is being concentrated or not uniformly dispersed therein. Therefore, the image forming material has good dispersibility. Therefore, the image formed with the involved material has a high-resolution and an even-density.

BRIEF DESCRIPTION OF THE DRAWINGS

Preferred embodiments of the invention will be described in detail with reference to the following figures wherein.

DETAILED DESCRIPTION OF THE PREFERRED EMBODIMENT

The invention will be explained with reference to the figures.

The structure of the photosensitive microcapsule of the first embodiment will be explained with reference to FIG. 1. A photosensitive microcapsule 1 of the first embodiment comprises an outer shell 2 which contains a photosensitive part 5 as an outer layer and a color material part 3 as an inner core in the form of a droplet. The photosensitive part 5 and the color material part 3 are separated from each other within the outer shell 2 based upon their different characteristics that make them immiscible in and non-reactive to one another. The diameter of the photosensitive microcapsule 1 is in a range from 1 μm to 100 μm, more preferably it is in a range from 5 μm to 30 μm. The diameter of the color material part 3 is preferably equal to or smaller than two thirds of the diameter of the photosensitive microcapsule 1. However, this invention is not limited to the above-mentioned diameters of the photosensitive microcapsule 1 and the color material part 3. What is important in the invention is that the color material part 3 and the photosensitive part 5 are separated from one another in the photosensitive microcapsule 1. This separation may be achieved by separating the color material part 3 and the photosensitive part 5 under an emulsion condition or by use of an inner capsule for holding the color material.

Figure 1:
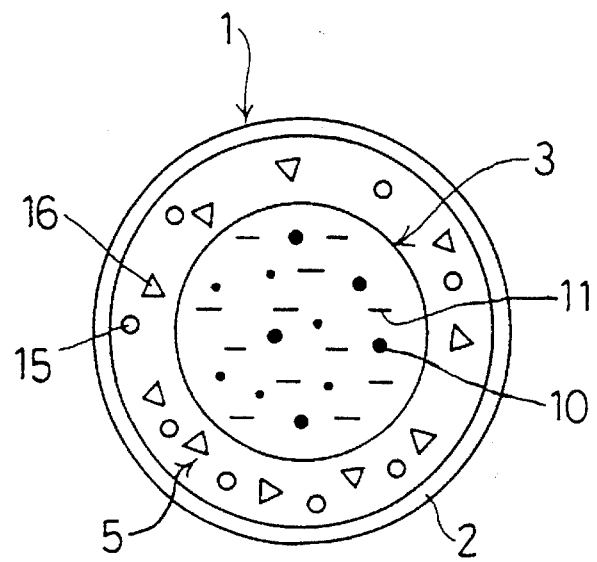
FIG. 1 is an expanded sectional view of a photosensitive microcapsule of a first embodiment of the invention.

Therefore, the photosensitive microcapsule 1 of the invention may have not only the structure of the first embodiment as shown in FIG. 1, but also have a structure as shown in FIGS. 2–8. The structures of the photosensitive microcapsules shown in FIGS. 2–8 will be briefly described. The same reference numerals are applied to structure elements which have the same structure as the first embodiment.

Figure 2:
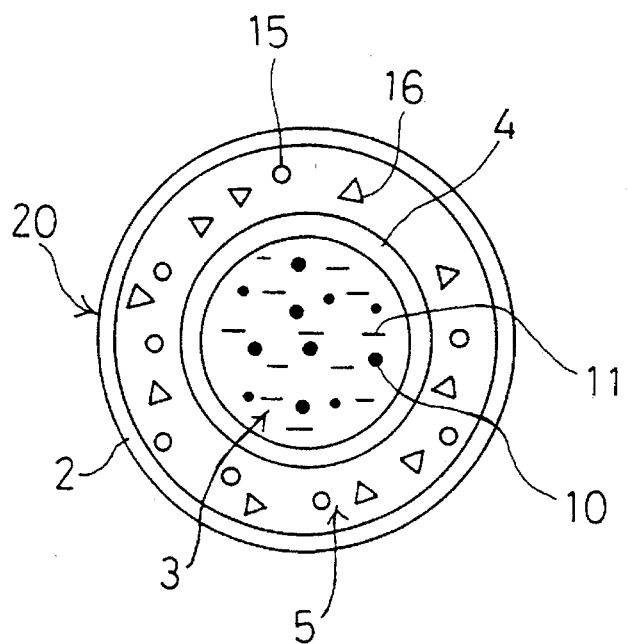
FIG. 2 is an expanded sectional view of a photosensitive microcapsule of a second embodiment of the invention.

FIG. 2 shows a photosensitive microcapsule 20 of the second embodiment. The photosensitive microcapsule 20 comprises the outer shell 2 and an inner shell 4 inside the outer shell 2. The outer shell 2 contains the photosensitive part 5 between it and the inner shell 4 and the inner shell 4 holds the color material part 3. That is, the color material part 3 is encapsuled by the inner shell 4 so that the color material part 3 and the photosensitive part 5 are separated from each other. Therefore, the photosensitive microcapsule 20 of the second embodiment is a double-capsule.

Figure 3:
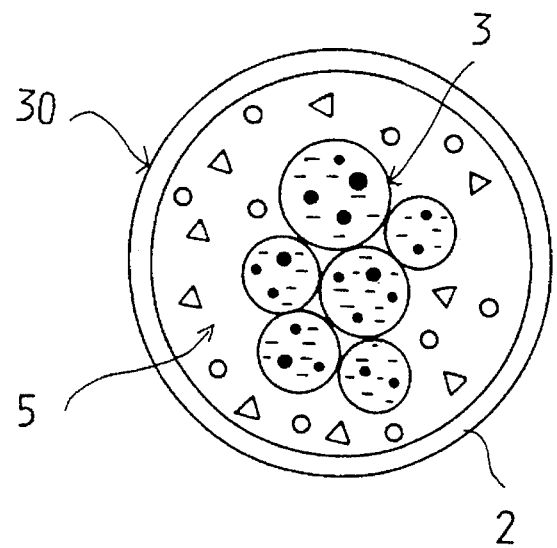
FIG. 3 is an expanded sectional view of a photosensitive microcapsule of a third embodiment of the invention.

FIG. 3 shows a photosensitive microcapsule 30 of the third embodiment. The photosensitive microcapsule 30 comprises the outer shell 2 which holds the photosensitive part 5 therein. Further, there are a plurality of color material parts 3, in the form of droplets within the photosensitive part 5. The plurality of color material parts 3 and the photosensitive part 5 are separated from each other based upon their characteristics that make them immiscible in and non-reactive to one another. Therefore, the photosensitive microcapsule 30 of the third embodiment is a so-called multi-nuclear capsule.

Figure 4:
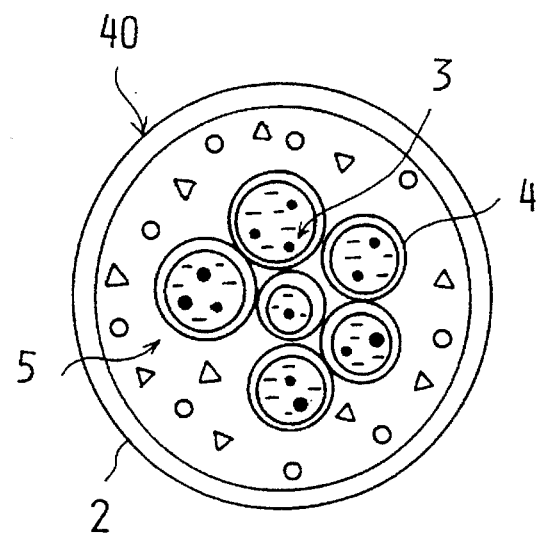
FIG. 4 is an expanded sectional view of a photosensitive microcapsule of a fourth embodiment of the invention.

FIG. 4 shows a photosensitive microcapsule 40 of the fourth embodiment. The photosensitive microcapsule 40 comprises the outer shell 2 which holds the photosensitive part 5 therein. Further, there are a plurality of color material parts 3 suspended in the photosensitive part 5. However, the plurality of color material parts 3 are respectively encapsuled in an inner shell 4 to thereby separate the plurality of color material parts 3 and the photosensitive part 5 from each other. Therefore, the photosensitive microcapsule 40 of the fourth embodiment is a double-multinuclear capsule.

Alternatively, the relative positions of the color material part 3 and the photosensitive part 5 can be reversed. When such is the case, the photosensitive microcapsules shown in FIGS. 5 through 8 are formed. In these embodiments, the photosensitive part 5 exists in the color material part 3 under a liquid drop condition. The diameter of the photosensitive part 5 is preferably equal to or smaller than two thirds of the diameter of the photosensitive microcapsule 1. However, this invention is not limited to the above-mentioned diameter of the photo-sensitive part 5.

Figure 5:
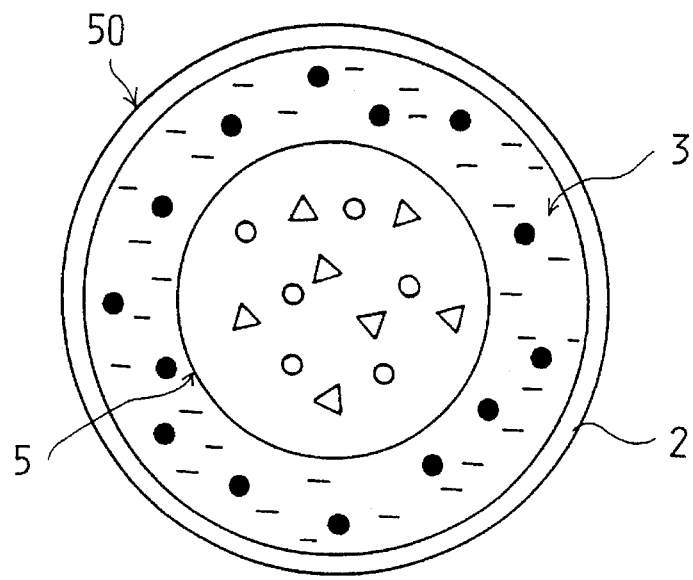
FIG. 5 is an expanded sectional view of a photosensitive microcapsule of a fifth embodiment of the invention.

FIG. 5 shows a photosensitive microcapsule 50 of the fifth embodiment. When the positions of the color material part 3 and photosensitive part 5 are reversed in the photosensitive microcapsule 1 from that of the first embodiment shown in FIG. 1, the photosensitive microcapsule 50 is formed. That is, the photosensitive microcapsule 50 has the outer shell 2 which holds the color material part 3 as an outer layer and the photosensitive part 5 as an inner core in the form of a droplet. The photosensitive part 5 and the color material part 3 are separated from each other in the outer shell 2 based on their immiscibility.

Figure 6:
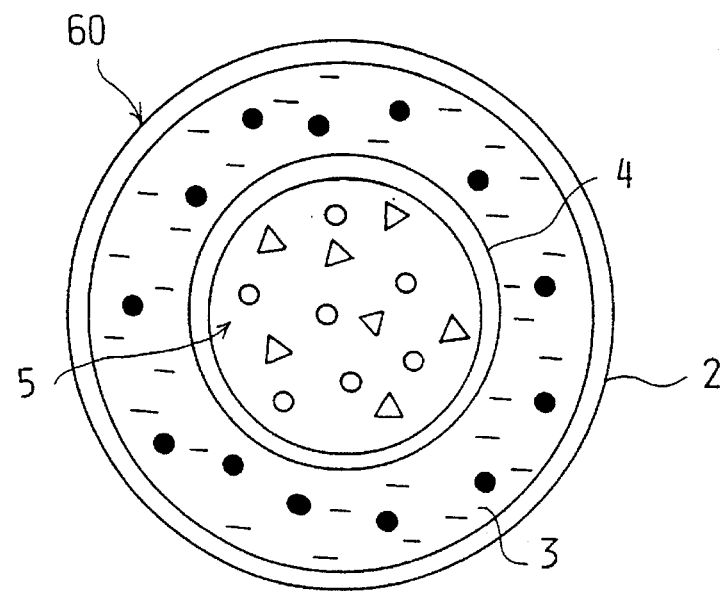
FIG. 6 is an expanded sectional view of a photosensitive microcapsule of a sixth embodiment of the invention.

FIG. 6 shows a photosensitive microcapsule 60 of the sixth embodiment. The photosensitive microcapsule 60 of the sixth embodiment has the outer shell 2 and an inner shell 4. The outer shell 2 contains the color material part 3 between it and the inner shell 4. The inner shell 4 holds the photosensitive part 5, that is, the photosensitive part 5 is encapsuled by the inner shell 4. As a result, the photosensitive part 5 and the color material part 3 are separated from each other. Therefore, the photosensitive microcapsule 60 of the sixth embodiment is a double-capsule.

Figure 7:
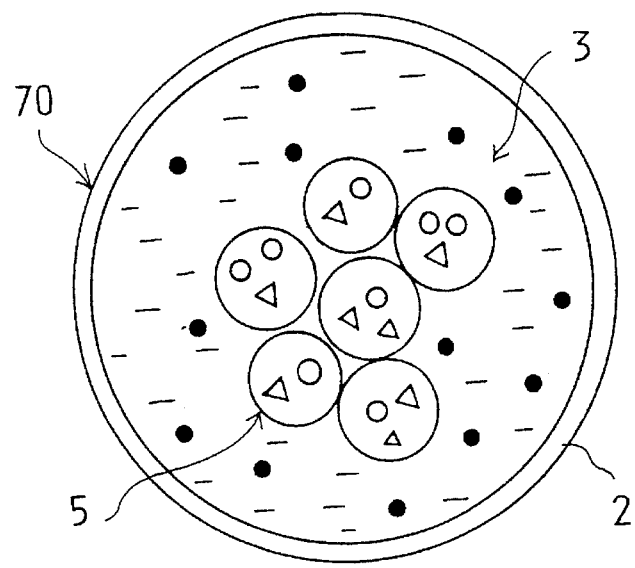
FIG. 7 is an expanded sectional view of a photosensitive microcapsule of a seventh embodiment of the invention.

FIG. 7 shows a photosensitive microcapsule 70 of the seventh embodiment. The photosensitive microcapsule 70 is the reverse of the third embodiment shown in FIG. 3. The photosensitive microcapsule 70 has the outer shell 2 which holds the color material part 3 therein. Further, there are a plurality of photosensitive parts 5, in the form of droplets, suspended in the color material part 3. The plurality of photosensitive parts 5 and the color material part 3 are separated from each other based on their immiscibility. Therefore, the photosensitive microcapsule 70 of the seventh embodiment is a so-called multinuclear capsule.

Figure 8:
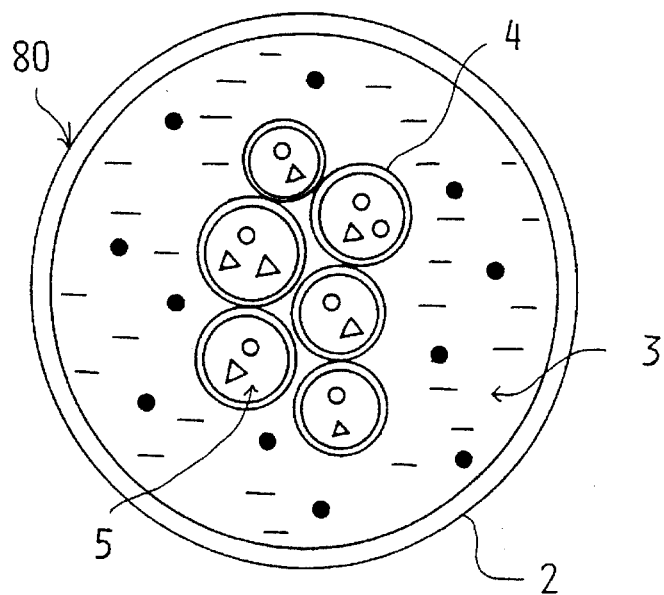
FIG. 8 is an expanded sectional view of a photosensitive microcapsule of an eighth embodiment of the invention.

FIG. 8 shows a photosensitive microcapsule 80 of the eighth embodiment. The photosensitive microcapsule 80 is the reverse of the fourth embodiment shown in FIG. 4. The photosensitive microcapsule 80 has the outer shell 2 which contains the color material part 3 therein. Further, there are a plurality of photosensitive parts 5 suspended in the color material part 3. The plurality of photosensitive parts 5 are encapsuled in inner shells 4 so that the plurality of photosensitive parts 5 and the color material part 3 are separated from each other. Therefore, the photosensitive microcapsule 80 of the eighth embodiment is a double-multinuclear capsule.

The color material part 3 comprises image forming material 10 and solvent 11. The image forming material 10 includes at least one of a dye, a pigment and a dye precursor. The solvent 11 is used for dissolving or mixing the image forming material 10 therein. When a water soluble image forming material 10 is used, water is the preferred solvent 11. When an oil soluble image forming material 10 is used, an organic solvent is the preferred solvent 11.

Further, as shown in FIGS. 1, 3, 5 and 7, when the photosensitive microcapsule 1 does not have the inner shell 4, that is, when the photosensitive microcapsule 1 is not the double-capsule type, it is preferable that the image forming material 10 does not dissolve in the material used as the photosensitive part 5. On the other hand, as shown in FIGS. 2, 4, 6 and 8, when the photosensitive microcapsule 1 is the double-capsule type, an image forming material 10 which dissolves in the material used as the photosensitive part 5 may be used as it is separated from the photosensitive part 5 by the inner shell 4. However, a material that does not dissolve in photosensitive part 5 can also be used as the image forming material 10 in the double-capsule.

A dye, an inorganic pigment, an organic pigment or a dyeprecursor which reacts with developer and produces color is used as the image forming material 10. More preferably the dye or pigment is selected from xanthene dyes, coumarin dyes, merocyanine dyes, thiazine dyes, azine dyes, methine dyes, oxazine dyes, phenylmethane dyes, cyanin dyes, azo dyes, anthraquinone dyes, pyrazoline dyes, stilbene dyes, quinoline dyes, leuco dyes, monoazo dyes, disazo dyes, azo lakes, quinacridone dyes, perylene dyes, anthrapyridine dyes, iso indolinone dyes, indanthrene dyes, phthalocyanine dyes, carbon black, chrome yellow, red iron oxide, titanium oxide, molybdate orange, cadmium red, cobalt blue, and chrome green. The preferable dye precursors are diphenylmethane compound, triphenylmethane compound, xanthene compound, thiazine compound, fluoran compound, and spiropyran compound. The image forming material 10 may be made from one of above-mentioned dyes, pigments and dye precursors, or may be made from a mixture thereof.

The photosensitive part 5 (the photosensitive material) is made from a photocurable material which forms an emulsion with the color material part 3 and which reacts on exposure to light to increase its mechanical strength. Usually, the photosensitive part 5 is made by mixing a photopolymerization initiator 15 and a component 16. Moreover, a coloring sensitizer may be mixed in the photosensitive part 5. When the photosensitive part 5 is mixed with a coloring sensitizer, the mechanical strength changes based on a visible ray determined by the coloring sensitizer.

The photopolymerization initiator 15 reacts to the light and starts the polymerization of the photocurable resin. Examples of materials for use as the photopolymerization initiator 15 are aromatic carbonyl compound; organic peroxide; diphenyl halonium; organohalogen compound; 2,4, 6-substituted-S-triazine; 2,4,5-triarylimidazole dimer; azo compound; dye borate complex; iron arene complex; and titanocene compound. Further, more preferably used as the photopolymerization initiator 15 are compounds such as benzophenone; benzil; xanthone; thioxanthone; anthraquinone; acetophenone; 2,2-dimethyl-2-morpholino-4'-methylthioacetophenone; benzoyl peroxide; 3,3',4,4'-tetra (tertiary butyl benzophenone); diphenyl iodonium bromide; diphenyl iodonium chloride; carbon tetrachloride; carbon tetrabromide; 2,4,6-tris trichloro-methyl-S-triazine; and ($\eta^5$-2,4-cyclopentadien-1-yl)[(1,2,3,4,5,6-$\eta$)-(1-methylethyl)-benzene] -iron(1+)-hexafluorophosphate(1−) Moreover, the above-mentioned materials may be used alone or as a mixture as the photopolymerization initiator 15.

The component 16 may be a member selected from the group consisting of a monomer, polymer, oligomer, copolymer or tripolymer. Preferred monomers are N-vinyl-2-pyrrolidone, bisphenol A diacrylate and methacrylate, tripropylene glycol di(meth)acrylate and methacrylate, polyethylene glycol di(meth)acrylate and methacrylate, pentaerythritol tri(meth) acrylate and methacrylate, dipentaerythritol hexa(meth) acrylate and methacrylate, triethylolpropane tri(meth)acrylate and methacrylate, and oligo ester (meth)acrylate and methacrylate. Moreover the above-mentioned monomers may be used alone or as a mixture as the component 16.

Various colorings may be used as the coloring sensitizer. Preferred colorings are carbonium dyes, onium dyes, anthraquinone dyes, cyanine dyes, and merocyanine dyes. The above-mentioned dyes can dissolve in the photopolymerization initiator 15 or polymer 16, that is, the above-mentioned dyes can be selected independently of the image forming material 10.

Moreover, examples of materials that can be used as the forming material for the outer shell 2 and the inner shell 4 are gelatin, gum arabic, starch, alginic acid soda, polyvinyl alcohol, polyethylene, polyamide, polyester, polyurethane, polyurea, polystyrene, nitrocellulose, ethylcellulose, methylcellulose, melamine-formaldehyde resin, and urea-formaldehyde resin. Further, a copolymer comprising the above-mentioned materials can be used. The above-mentioned materials are sufficiently transparent to the light so that the light is received by the photosensitive part 5. Thus, shells made of such materials are transparent to light affecting the photosensitive material.

The photosensitive microcapsule 1 having the above-described structure can be made by known methods. For example, a method of separating materials from aqueous solution is disclosed in U.S. Pat. No. 2,800,457 and U.S. Pat. No. 2,800,458. An interfacial polymerization method is disclosed in Japanese Patent Publication No. 42-446 and Japanese Patent Publication No. 42-771. An in-situ method of polymerizing the monomer is disclosed in Japanese Patent Publication No. 51-9079. A fusion dispersion cooling method is disclosed in U.K. Patent 952807. However, the method of making the photosensitive microcapsule of the invention is not limited to the above mentioned methods. Moreover, the double-capsule or the double-multinuclear capsule shown in FIGS. 2, 4, 6 and 8 can be formed by selecting various methods mentioned above.

In the invention, when the photosensitive microcapsules 1 of the first embodiment, shown in FIG. 1, or the photosensitive microcapsules 30 of the third embodiment, shown in FIG. 3, are formed in practice, a photosensitive microcapsule group including both the photosensitive microcapsules 1 and the photosensitive microcapsules 30 is produced. Moreover, in a similar manner as described above, when the photosensitive microcapsules 50 of the fifth embodiment, shown in FIG. 5, or the photosensitive microcapsules 70 of the seventh embodiment, shown in FIG. 7, are formed in practice, a photosensitive microcapsule group including both the photosensitive microcapsules 50 and the photosensitive microcapsules 70 is produced.

In a similar manner to that described above, when the photosensitive microcapsules 20 of the second embodiment, shown in FIG. 2, or the photosensitive microcapsules 40 of the fourth embodiment, shown in FIG. 4, are formed in practice, a photosensitive microcapsule group including both the photosensitive microcapsules 20 and the photosensitive microcapsules 40 is produced. Further, when the photosensitive microcapsules 60 of the sixth embodiment, shown in FIG. 6, or the photosensitive microcapsules 80 of the eighth embodiment, shown in FIG. 8, are formed in practice, a photosensitive microcapsule group including both the photosensitive microcapsules 60 and the photosensitive microcapsules 80 is produced. However, in the invention, there is no need to separate photosensitive microcapsules having the same structure from the photosensitive microcapsule group as the two photosensitive microcapsule types found in each of the produced microcapsule groups have substantially the same properties for producing clear, sharp print.

Hereinafter, the invention will be described with reference to experiments.

EXPERIMENT 1

In experiment 1, a photosensitive microcapsule for yellow image forming, comprising a color material part 3 including a yellow pigment and a photosensitive part 5, which is sensitive to an ultraviolet ray, was formed.

First, the following was provided: 100 parts by weight of a mixture of polyethylene glycol diacrylate and dipentaerythritol hexaacrylate (mixing ratio 3:4); 2 parts by weight of 2,2-dimethyl-2-morpholino-4'-methylthioacetophenone; and 2 parts by weight of 2,4-diethyl thioxanthone. They were mixed at 100° C. for 10 minutes, thereby forming a hydrophobic photosensitive part 5.

Next, the following was prepared: 60 parts by weight of demineralized water; 5 parts by weight of disazo yellow pigment; and 0.1 part by weight of surface active agent as the dispersant (TRADE NAME: KAO DEMOAL N, made by Kao Corporation). When the disazo yellow pigment was dispersed in the demineralized water by the surface active agent, the color material part 3 was formed.

The hydrophobic photosensitive part 5 and the color material part 3 were then mixed. The mixture was stirred by an agitator (homogenizer) at 10,000 rpm for five minutes, thereby forming a W/O (WATER IN OIL) emulsion. That is, there was color material part 3 having 1–5 μm length contained within the photosensitive part 5.

Next, an aqueous solution made up of 300 cc of a mixture of 5% aqueous solution of Sodium Polystyrenesulfonate, as an emulsifier, and a 5% aqueous solution of Styrene-Maleic Anhydride Copolymer (mixing ratio 1:1) was prepared. The W/O emulsion was added to the aqueous solution and stirred by the homogenizer at 3000 rpm for five minutes to form a W/O/W (WATER IN OIL IN WATER) emulsion.

A 37% aqueous solution of formaldehyde, melamine particles on the market, and sodium hydroxide was prepared by adding the melamine particles and the sodium hydroxide to the 37% aqueous solution of formaldehyde to obtain a 9.0 PH. The resultant solution was heated at 60° C. for thirty minutes to form melamine-formaldehydeprepolymer.

Following the formation of the melamine-formaldehydeprepolymer, it was added to the W/O/W emulsion. Further, an acid, such as hydrochloric acid or formic acid was added to the W/O/W emulsion to adjust the PH to a range of about 4.0–6.0 PH. The W/O/W emulsion was then stirred by an agitator (TRADE NAME: AGI HOMO MIXER, made by Tokushu Kika Kogyo Co., Ltd.) at 100–300 rpm at a temperature of 80° C. The W/O/W emulsion was kept under this condition, i.e., stirring and constant temperature, for five hours. After this, sodium hydroxide was added to the W/O/W emulsion to raise the PH to 7.0. Then, the W/O/W emulsion was cooled to room temperature. As a result, a wall of melamine-formaldehyde resin was deposited around each drop of the W/O emulsion, thereby forming the photosensitive microcapsule having the photosensitive part 5 made of the photosensitive material and the color material part 3 wherein the yellow pigment is dispersed. The photosensitive microcapsules so formed are a mixture of the photosensitive microcapsules 1 of the first embodiment, shown in FIG. 1, and the photosensitive microcapsules 30 of the third embodiment, shown in FIG. 3.

EXPERIMENT 2

In experiment 2, a photosensitive microcapsule for magenta image forming, comprising the color material part 3, which includes magenta pigment, and the photosensitive part 5, which is sensitive to an ultraviolet ray, is formed.

First, the following was prepared: 100 parts by weight of a mixture of polyethylene glycol diacrylate and dipentaerythritol hexaacrylate (mixing ratio 3:4); and 10 parts by weight of ($\eta^5$-2,4-cyclopentadien-1-yl)[(1,2,3,4,5,6-$\eta$)-(1-methylethyl)-benzene] -iron(1+)-Hexafluorophosphate(1−). The materials were mixed at 100° C. for 10 minutes, thereby forming the hydrophobic photosensitive part 5.

Next, the following was prepared: 60 parts by weight of demineralized water; 5 parts by weight of quinacridone magenta pigment; and 0.1 part by weight of surface active agent as the dispersant (KAO DEMOAL N). The quinacridone magenta pigment was dispersed in the demineralized water by the surface active agent and the color material part 3 formed.

The following was then prepared: 1 g of lauroyl peroxide; 4 g of divinylbenzene; 35 g of styrene; and 2 g of surface active agent (TRADE NAME: SPAN 80, made by Wako Pure Chemical Industries, Ltd.). The lauroyl peroxide, divinylbenzene, styrene and surface active agent were mixed and the color material part 3 was added to the mixture. The resultant mixture was stirred by a homogenizer at 4000 rpm for three minutes to form W/O emulsion containing color material parts 3 having a length of 1–5 μm.

Further, an aqueous solution comprising a mixture of 2% aqueous solution of polyvinyl alcohol and 1% aqueous solution of Sodium Polystyrenesulfonate (mixing ratio 1:1) was prepared. The W/O emulsion was added to the aqueous solution and stirred by the homogenizer at 1500 rpm for one minute, thereby forming a W/O/W emulsion. The W/O/W emulsion was then heated at 80° C. and stirred by an AGI HOMO MIXER at 300 rpm for three hours, thereby forming small capsules containing the color material part 3 within polystyrene walls.

The small capsules were irrigated and dried. After this, the small capsules were mixed with the hydrophobic photosensitive part 5. Next, 300 cc of a mixture of 5% aqueous solution of Sodium Polystyrenesulfonate and 5% aqueous solution of Styrene-Maleic Anhydride Copolymer (mixing ratio 1:1) was prepared. The mixture of the small capsules and the hydrophobic photosensitive part 5 was added to 300 cc aqueous solution and stirred by the homogenizer at 2500 rpm for five minutes, thereby forming an emulsion wherein the photosensitive part 5 contained at least one small capsule.

Next, the following was prepared: 37% aqueous solution of formaldehyde; melamine particles on the market; and sodium hydroxide. The melamine particles and the sodium hydroxide are added to the 37% aqueous solution of formaldehyde to obtain 9.0 PH. The resultant solution was heated at 60° C. for thirty minutes, thereby forming melamine·formaldehydeprepolymer.

Next, the melamine·formaldehydeprepolymer was added to the emulsion of the photosensitive part 5 having at least one small capsule. Further, an acid, such as hydrochloric acid or formic acid, was added to the emulsion of the photosensitive part 5 to obtain a range of 4.0–6.0 PH. The resultant emulsion of the photosensitive part 5 was stirred by the AGI HOMO MIXER at 100–300 rpm at a temperature of 80° C. The emulsion of the photosensitive part 5 was stirred under these constant conditions for five hours. After this, sodium hydroxide was added to the emulsion to raise the PH to 7.0. The emulsion of the photosensitive part 5 was then cooled to room temperature. As a result, a wall of melamine-formaldehyde resin was deposited around the drop of the emulsion thereby forming a photosensitive microcapsule comprising the photosensitive part 5 made of the photosensitive material and at least one small capsule containing the color material part 3 wherein the magenta pigment was dispersed. The photosensitive microcapsules formed in the above-mentioned method are a mixture of the photosensitive microcapsule 20 of the second embodiment, shown in FIG. 2 and the photosensitive microcapsule 40 of the fourth embodiment, shown in FIG. 4.

EXPERIMENT 3

In experiment 3, a photosensitive microcapsule for cyanogen image forming, comprising the color material part 3, which includes cyanogen pigment, and the photosensitive part 5, which is sensitive to an ultraviolet ray, was formed.

First, the following was provided: 100 parts by weight of a mixture of polyethylene glycol diacrylate and dipentaerythritol hexaacrylate (mixing ratio 3:4), and 10 parts by weight of [($\eta$5-2,4-cyclopentadiene-1-yl) [(1,2,3,4,5,6-$\eta$)-(1-methylethyl)benzene]iron (1+) hexaflorophosphate(1−)]. They were mixed and heated at 100° C. for 10 minutes, thereby forming the hydrophobic photosensitive part 5.

Next, the following was prepared: 60 parts by weight of demineralized water, 5 parts by weight of phthalocyanine cyanogen pigment, 0.1 part by weight of surface active agent as the dispersant (KAO DEMOAL N), and 20 ml of 10% aqueous solution of polyvinyl alcohol. After the phthalocyanine cyanogen pigment was dispersed in the demineralized water by the surface active agent, it was mixed with the 20 ml of 10% aqueous solution of polyvinyl alcohol so that the hydrophilic color material part 3 was formed.

The hydrophobic photosensitive part 5 was then added to the hydrophilic color material part 3 and was stirred by the homogenizer at 3000 rpm for three minutes, thereby forming an O/W (OIL IN WATER) emulsion.

Further, the following was prepared by mixing: 1 part by weight of lauroyl peroxide, 4 parts by weight of divinylbenzene, 35 part by weight of styrene, and 2 parts by weight of surface active agent (SPAN 80). The O/W emulsion was added to the mixture and stirred by the homogenizer at 2000 rpm for five minutes, thereby forming an O/W/O (OIL IN WATER IN OIL) emulsion.

After this, the O/W/O emulsion was heated at 80° C. and stirred by the AGI HOMO MIXER at 300 rpm for three hours, thereby forming the photosensitive microcapsules comprising the color material part 3, wherein the cyanogen pigment is dispersed, and the photosensitive part 5 made of photosensitive material with a polystyrene wall. The photosensitive microcapsules formed in the above-mentioned method are a mixture of the photosensitive microcapsules 50 of the fifth embodiment, shown in FIG. 5 and the photosensitive microcapsules 70 of the seventh embodiment, shown in FIG. 7.

EXPERIMENT 4

In experiment 4, a photosensitive microcapsule for magenta image forming, comprising the color material part 3, which includes magenta pigment, and the photosensitive part 5, which is sensitive to an ultraviolet ray, was formed.

First, the following was provided: 100 parts by weight of a mixture of polyethylene glycol diacrylate and dipentaerythritol hexaacrylate (mixing ratio 3:4), and 10 parts by weight of [($\eta$5-2,4-cyclopentadiene-1-yl) [(1,2,3,4,5,6-$\eta$)-(1-methylethyl)benzene]iron (1+) hexaflorophosphate(1−)]. They were mixed at 100° C. for 10 minutes, thereby forming the hydrophobic photosensitive part 5.

Next, the following was prepared: 60 parts by weight of demineralized water, 5 parts by weight of quinacridone magenta pigment, and 0.1 part by weight of surface active agent as the dispersant (KAO DEMOAL N). When the quinacridone magenta pigment was dispersed in the demineralized water by the surface active agent, the hydrophilic color material part 3 was formed.

Next, 300 cc of a mixture of 5% aqueous solution of Sodium Polystyrenesulfonate as an emulsifier and 5% aqueous solution of Styrene-Maleic Anhydride Copolymer (mixing ratio 1:1) was prepared. The hydrophobic photosensitive part 5 was added in the aqueous solution and stirred by the homogenizer at 3000 rpm for five minutes, thereby forming an O/W emulsion. There were produced photosensitive parts 5 having a length of 1–5 μm in the aqueous solution.

Next, the following was prepared: 37% aqueous solution of formaldehyde, melamine particles on the market, and sodium hydroxide. The melamine particles and the sodium hydroxide were added to the 37% aqueous solution of formaldehyde to obtain 9.0 PH. The aqueous solution was heated at 60° C. for thirty minutes, thereby forming melamine-formaldehydeprepolymer.

Next, the melamine-formaldehydeprepolymer was added to the O/W emulsion. Further, an acid, such as hydrochloric acid or formic acid, was added to the O/W emulsion to obtain a 4.0–6.0 PH. The O/W emulsion was stirred by the AGI HOMO MIXER at 100–300 rpm at 80° C. The O/W emulsion was stirred under these constant conditions for five hours. After this, the sodium hydroxide was added to the O/W emulsion to obtain a 7.0 PH. The O/W emulsion was then cooled to room temperature. As a result, a wall of melamine-formaldehyde resin was deposited around of the drops of the O/W emulsion, thereby forming small capsules involving the photosensitive part 5.

The small capsules were irrigated and dried and the small capsules were mixed with the hydrophilic color material 3.

Further, 1 part by weight of lauroyl peroxide, 4 parts by weight of divinylbenzene, 35 parts by weight of styrene and 2 parts by weight of surface active agent (SPAN 80) were mixed and had the mixture of color material 3 and small capsules added thereto. The above-mentioned mixture was stirred by the homogenizer at 2500 rpm for five minutes, thereby forming an emulsion comprising color material 3 having at least one small capsule. After this, the resultant emulsion was heated at 80° C. and stirred by the AGI HOMO MIXER at 300 rpm for three hours, thereby forming the photosensitive microcapsule comprising the color material part 3, wherein the magenta pigment is dispersed, and the photosensitive part 5 made of photosensitive material with polystyrene wall.

The photosensitive microcapsules formed in the above-mentioned method are a mixture of the photosensitive microcapsules 60 of the sixth embodiment, shown in FIG. 6, and the photosensitive microcapsules 80 of the eighth embodiment, shown in FIG. 8.

The photosensitive microcapsules made by the above-described methods, can be exposed using low energy yet produce an even density and high resolution in comparison with conventional photosensitive microcapsules.

As is apparent from the above explanation, the photosensitive microcapsules of the invention can prevent the image forming material from being condensed or being partially destroyed. The photosensitive microcapsules of the invention can be hardened using low energy by comparison with conventional microcapsules. Further, according to the photosensitive microcapsules of the invention, an image having an even density and high resolution is formed.

This invention is not limited to the above mentioned embodiments. It should be understood that many changes and modifications may be made in the embodiments without departing from the scope of the invention.

That is, even if the materials selected, the amount thereof, or the method of forming photosensitive microcapsules are changed within the described range, the photosensitive microcapsules of the invention can be made.

What is claimed is:

1. A photosensitive microcapsule, comprising:

an outer shell;

an image forming part which is a liquid medium in which an image forming material is contained; and a photosensitive part which is a liquid photosensitive material comprising (a) a member selected from the group consisting of a monomer and an oligomer and (b) an initiator, wherein the image forming material comprises at least one image forming material selected from the group consisting of a dye, a pigment, and a dye precursor, the liquid photosensitive material changes mechanical strength by reacting to light, and said image forming part and said photosensitive part form an emulsion and are separated from one another within said outer shell;

and wherein said initiator is at least one compound selected from the group consisting of organic peroxide; organohalogen compound; 2,4,6-substituted-S-triazine; 2,4,5-triarylimidazole dimer; azo compound; dye borate complex; iron arene complex; titanocene compound; and aromatic carbonyl compound.

2. The photosensitive microcapsule according to claim 1, wherein said image forming part is formed as at least one droplet as an inner core suspended in said photosensitive part.

3. The photosensitive microcapsule according to claim 1, wherein said image forming part is formed as at least one small microcapsule encapsulated by an inner shell and suspended in said photosensitive part.

4. The photosensitive microcapsule according to claim 3, wherein said inner and outer shell are made from a material selected from the group consisting of gelatin, gum arabic, starch, alginic acid soda, polyvinyl alcohol, polyethylene, polyamide, polyester, polyurethane, polyurea, polystyrene, nitrocellulose, ethylcellulose, methylcellulose, melamine-formaldehyde resin, urea-formaldehyde resin and the copolymers of melamine-formaldehyde resin and urea-formaldehyde resin.

5. The photosensitive microcapsule according to claim 1, wherein the liquid photosensitive part is formed as at least one droplet as an inner core suspended in said image forming part.

6. The photosensitive microcapsule according to claim 1, wherein said photosensitive part is formed as at least one small microcapsule encapsulated by an inner shell and suspended in said image forming part.

7. The photosensitive microcapsule according to claim 6, wherein said inner and outer shell are made from a material selected from the group consisting of gelatin, gum arabic, starch, alginic acid soda, polyvinyl alcohol, polyethylene, polyamide, polyester, polyurethane, polyurea, polystyrene, nitrocellulose, ethylcellulose, methylcellulose, melamine-formaldehyde resin, urea-formaldehyde resin and the copolymers of melamine-formaldehyde resin and urea-formaldehyde resin.

8. The photosensitive microcapsule according to claim 1, wherein one of said image forming material and said photosensitive material is lipophilic and the other of said image forming material and said photosensitive material is hydrophilic.

9. The photosensitive microcapsule according to claim 1, further comprising a dispersant for uniformly dispersing said image forming material.

10. The photosensitive microcapsule according to claim 1, wherein said image forming material is selected from at least one of the group consisting of xanthene dyes, coumarin dyes, merocyanine dyes, thiazine dyes, azine dyes, methine dyes, oxazine dyes, phenylmethane dyes, cyanine dyes, azo dyes, anthraquinone dyes, pyrazoline dyes, stilbene dyes, quinoline dyes, leuco dyes, monoazo dyes, disazo dyes, azo lakes, quinacridone dyes, perylene dyes, anthrapyridine dyes, iso indolinone dyes, indanthrene dyes, phthalocyanine dyes, carbon black, chrome yellow, red iron oxide, titanium oxide, molybdate orange, cadmium red, cobalt blue, chrome green, diphenylmethane compound, triphenylmethane compound, xanthene compound, thiazine compound, fluoran compound and spiropyran compound.

11. The photosensitive microcapsule according to claim 1, wherein said component (a) is at least one monomer selected from the group consisting of N-vinyl-2-pyrrolidone, bisphenol A diacrylate or methacrylate, tripropylene glycol diacrylate or dimethacrylate, polyethylene glycol diacrylate or dimethacrylate, pentaerythritol triacrylate or trimethacrylate, dipentaerythritol hexacrylate or hexamethacrylate, triethylolpropane triacrylate or trimethacrylate, and oligo ester acrylate or methacrylate.

12. The photosensitive microcapsule according to claim 1, wherein said initiator is at least one compound selected from the group consisting of benzophenone; benzil; xanthone; thiozanthone; anthraquinone; acetophenone; 2,2-dimethyl-2-morpholino-4'-methylthioacetophenone; benzoyl peroxide; 3,3',4,4'-tetra (tertiary butyl) benzophenone; diphenyl iodonium bromide; diphenyl iodonium chloride; carbon tetrachloride; carbon tetrabromide; 2,4,6-tris trichloromethyl-S-triazine; and ($\eta^5$-2,4-cyclopentadien-1-yl)[(1,2,3,4,5,6-$\eta$)-(1-methylethyl)-benzene] -iron(1+)-hexafluorophosphate(1−).

13. A photosensitive microcapsule, comprising:
    an outer shell;
    a coloring agent of at least one material selected from the group consisting of a dye, a dye precursor and a pigment dissolved or mixed in a liquid medium; and
    a liquid photosensitive material comprising (a) a member selected from the group consisting of a monomer and an oligomer and (b) an initiator, wherein said coloring agent and said photosensitive material are contained within said outer shell as an emulsion and are immiscible in and non-reactive to one another;
    and wherein said initiator is at least one compound selected from the group consisting of organic peroxide; organohalogen compound; 2,4,6-substituted-S-triazine; 2,4,5-triarylimidazole dimer; azo compound; dye borate complex; iron arene complex; titanocene compound; aromatic carbonyl compound.

14. The photosensitive microcapsule according to claim 13, wherein one of said coloring agent and said photosensitive material forms at least one droplet as an inner core to the microcapsule and the other of said coloring agent and said photosensitive material provides a layer between said outer shell and said inner core.

15. The photosensitive microcapsule according to claim 14, wherein each said at least one droplet is contained within an inner shell.

16. The photosensitive microcapsule according to claim 15, wherein said inner and outer shell are made from a material selected from the group consisting of gelatin, gum arabic, starch, alginic acid soda, polyvinyl alcohol, polyethylene, polyamide, polyester, polyurethane, polyurea, polystyrene, nitrocellulose, ethylcellulose, methylcellulose, melamine-formaldehyde resin, urea-formaldehyde resin and the copolymers of melamine-formaldehyde resin and urea-formaldehyde resin.

17. The photosensitive microcapsules according to claim 15, wherein said inner and outer shells are transparent to light affecting said photosensitive material.

18. The photosensitive microcapsule according to claim 13, wherein said photosensitive material further comprises a coloring sensitizer.

19. The photosensitive microcapsule according to claim 13, wherein said coloring sensitizer is selected from the group consisting of, onium dyes, anthraquinone dyes, cyanine dyes, and merocyanine dyes.

20. The photosensitive microcapsule according to claim 13, wherein said monomer is selected from the group consisting of N-vinyl-2-pyrrolidone, bisphenol A diacrylate or methacrylate, tripropylene glycol diacrylate or dimethacrylate, polyethylene glycol diacrylate or dimethacrylate, pentaerythritol triacrylate or trimethacrylate, dipentaerythritol hexacrylate or hexamethacrylate, triethylolpropane triacrylate or trimethacrylate, and oligo ester acrylate or methacrylate.

21. The photosensitive microcapsules according to claim 13, wherein said coloring agent is at least one agent selected from the group consisting of xanthene dyes, coumarin dyes, merocyanine dyes, thiazine dyes, azine dyes, methine dyes, oxazine dyes, phenylmethane dyes, cyanine dyes, azo dyes, anthraquinone dyes, pyrazoline dyes, stilbene dyes, quinoline dyes, leuco dyes, monoazo dyes, disazo dyes, azo lakes, dyes, quinacridone dyes, perylene dyes, anthrapyridine dyes, iso indolinone dyes, indanthrene dyes, phthalocyanine dyes, carbon black, chrome yellow, red iron oxide, titanium oxide, molybdate orange, cadmium red, cobalt blue, and chrome green.

22. The photosensitive microcapsule according to claim 13, wherein said dye precursor is at least one selected from the group consisting of diphenylmethane compound, triphenylmethane compound, xanthene compound, thiazine compound, fluoran compound, and spiropyran compound.

23. The photosensitive microcapsule according to claim 13, wherein said initiator is at least one compound selected from the group consisting of benzophenone; benzil; xanthone; thiozanthone; anthraquinone; acetophenone; 2,2-dimethyl-2-morpholino-4'-methylthioacetophenone; benzoyl peroxide; 3,3',4,4'-tetra (tertiary butyl) benzophenone; diphenyl iodonium bromide; diphenyl iodonium chloride; carbon tetrachloride; carbon tetrabromide; 2,4,6-tris trichloromethyl-S-triazine; and ($\eta^5$ -2,4-cyclopentadien-1-yl)[(1,2,3,4,5,6-$\eta$)-(1-methylethyl)-benzene] -iron(1+)-hexafluorophosphate(1−).

24. A photosensitive microcapsule, comprising:
    an outer shell;
    an image forming part which is a liquid medium in which an image forming material is contained; and
    a photosensitive part which is a liquid photosensitive material comprising (a) a member selected from the group consisting of a monomer and an oligomer and (b) an initiator, wherein the image forming material comprises at least one image forming material selected from the group consisting of a dye, a pigment, and a dye precursor, the liquid photosensitive material changes mechanical strength by reacting to light, and said image forming part and said photosensitive part form an emulsion and are separated from one another within said outer shell;

wherein the photosensitive park is formed as at least one droplet as an inner core suspended in said image forming part.

25. A photosensitive microcapsule, comprising:

an outer shell;

an image forming part which is a liquid medium in which an image forming material is contained; and a photosensitive part which is a liquid photosensitive material comprising (a) a member selected from the group consisting of a monomer and an oligomer and (b) an initiator, wherein the image forming material comprises at least one image forming material selected from the group consisting of a dye, a pigment, and a dye precursor, the liquid photosensitive material changes mechanical strength by reacting to light, and said image forming part and said photosensitive part form an emulsion and are separated from one another within said outer shell;

wherein said photosensitive part is formed as at least one small microcapsule encapsulated by an inner shell and suspended in said image forming part.

* * * * *